(12) United States Patent
Zhang et al.

(10) Patent No.: US 11,758,770 B2
(45) Date of Patent: Sep. 12, 2023

(54) DISPLAY PANEL AND DISPLAY DEVICE WITH PIXEL ELECTRODE OVERLAPPING TRANSPARENT WIRES CONFIGURED TO REDUCE LASER-ETCHING DAMAGE

(71) Applicant: Wuhan Tianma Micro-Electronics Co., Ltd., Wuhan (CN)

(72) Inventors: Guofeng Zhang, Wuhan (CN); Junqiang Wang, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 77 days.

(21) Appl. No.: 17/216,958

(22) Filed: Mar. 30, 2021

(65) Prior Publication Data

US 2022/0208910 A1 Jun. 30, 2022

(30) Foreign Application Priority Data

Dec. 29, 2020 (CN) .......................... 202011595474.7

(51) Int. Cl.
| | |
|---|---|
| *H10K 59/123* | (2023.01) |
| *H10K 59/40* | (2023.01) |
| *H10K 59/131* | (2023.01) |
| *H10K 71/00* | (2023.01) |
| *H10K 59/12* | (2023.01) |

(52) U.S. Cl.
CPC ....... *H10K 59/123* (2023.02); *H10K 59/1315* (2023.02); *H10K 59/40* (2023.02); *H10K 71/00* (2023.02); *H10K 59/1201* (2023.02)

(58) Field of Classification Search
CPC . H01L 27/2348; H01L 27/3279; H01L 51/56; H01L 2227/323; H10K 59/12; H10K 59/1201; H10K 59/123; H10K 59/1315; H10K 71/00; H10K 71/40; H10K 71/421; H10K 71/441
USPC .......................................................... 257/40
See application file for complete search history.

(56) References Cited

U.S. PATENT DOCUMENTS

| | | | | |
|---|---|---|---|---|
| 2017/0062548 | A1* | 3/2017 | Han | ..................... H01L 27/3279 |
| 2017/0352718 | A1* | 12/2017 | Kim | ..................... H01L 27/3279 |
| 2018/0190944 | A1* | 7/2018 | Lee | ..................... H01L 27/3279 |

(Continued)

FOREIGN PATENT DOCUMENTS

CN 110570770 A 12/2019

*Primary Examiner* — Matthew E. Gordon
(74) *Attorney, Agent, or Firm* — ANOVA LAW GROUP PLLC

(57) ABSTRACT

The present disclosure provides a display panel having a first display area and a second display area, the display panel including: a substrate; a driving device layer on a side of the substrate, including transistors; a first electrode layer in the first display area and on a side of the driving device layer away from the substrate, including first electrodes; a first transparent part in the first display area and between the driving device layer and the first electrode layer, including first padding layers, which are electrically connected to the transistors; and a second transparent part in the first display area and between the first transparent part and the first electrodes, including second padding layers for connecting to the first padding layers, that the transistors transmit signals to the first electrodes through the first padding layers and the second padding layers.

15 Claims, 14 Drawing Sheets

(56) References Cited

U.S. PATENT DOCUMENTS

2018/0337223 A1* 11/2018 Lee ..................... H01L 27/3276
2022/0123074 A1* 4/2022 Zhang ................. H01L 27/3218
2022/0310768 A1* 9/2022 Long ....................... H01L 27/32

* cited by examiner

DISPLAY PANEL AND DISPLAY DEVICE WITH PIXEL ELECTRODE OVERLAPPING TRANSPARENT WIRES CONFIGURED TO REDUCE LASER-ETCHING DAMAGE

CROSS-REFERENCE TO RELATED APPLICATION

This application claims the priority of Chinese Patent Application No. CN202011595474.7, filed on Dec. 29, 2020, the entire contents of all of which are incorporated herein by reference.

FIELD OF THE DISCLOSURE

The present disclosure generally relates to the field of display apparatus technologies and, in particular, relates to a display panel, a display device, and a fabrication method of the display panel.

BACKGROUND

With rapid development of electronic devices, users have higher and higher requirements for a screen-to-body ratio, making a full-screen display of electronic devices attract more and more attention in the industry.

Existing electronic devices such as mobile phones and tablet computers need to integrate front-mounted photosensitive components, earpieces, and infrared sensing elements. In existing technologies, a notch or hole can be formed on a display screen, and external light can enter a photosensitive element under the screen through the notch or hole on the screen. However, these electronic devices are not full-screen in a true sense, and cannot display in all areas of the entire screen. For example, a corresponding area of the front-mounted photosensitive components cannot display pictures.

BRIEF SUMMARY OF THE DISCLOSURE

One aspect of the present disclosure provides a display panel having a first display area and a second display area, the display panel including: a substrate; a driving device layer on a side of the substrate, that the driving device layer includes a plurality of transistors; a first electrode layer in the first display area and on a side of the driving device layer away from the substrate, that the first electrode layer includes a plurality of first electrodes; a first transparent part in the first display area and between the driving device layer and the first electrode layer, that the first transparent part includes first padding layers, and the first padding layers are electrically connected to the plurality of transistors; and a second transparent part in the first display area and between the first transparent part and the plurality of first electrodes, that the second transparent part includes second padding layers for connecting to the first padding layers, that the plurality of transistors transmits signals to the plurality of first electrodes through the first padding layers and the second padding layers.

Another aspect of the present disclosure provides a display device, including: a display panel having a first display area and a second display area, the display panel including: a substrate; a driving device layer on a side of the substrate, that the driving device layer includes a plurality of transistors; a first electrode layer in the first display area and on a side of the driving device layer away from the substrate, that the first electrode layer includes a plurality of first electrodes; a first transparent part in the first display area and between the driving device layer and the first electrode layer, that the first transparent part includes first padding layers, and the first padding layers are electrically connected to the plurality of transistors; and a second transparent part in the first display area and between the first transparent part and the plurality of first electrodes, that the second transparent part includes second padding layers for connecting to the first padding layers, that the plurality of transistors transmits signals to the plurality of first electrodes through the first padding layers and the second padding layers.

Another aspect of the present disclosure provides a fabrication method for a display panel having a first display area and a second display area, the method including: providing a substrate, that a driving device layer is formed on the substrate, and the driving device layer includes a plurality of transistors; forming a first insulating layer on a side of the driving device layer away from the substrate, that the first insulating layer is patterned to form first openings in the first display area, and at least a portion of the plurality of transistors is exposed by the first openings; forming a first transparent part on a side of the first insulating layer away from the driving device layer, that the first transparent part is in the first display area, the first transparent part is patterned to form first padding layers, and the first padding layers are connected to the plurality of transistors through the first openings; forming a second insulating layer on a side of the first transparent part away from the first insulating layer, that the second insulating layer is patterned to form second openings in the first display area, and at least a portion of the first padding layers is exposed by the second openings; forming a second transparent part on a side of the second insulating layer away from the first transparent part, that the second transparent part is in the first display area, the second transparent part is patterned to form second padding layers, and the second padding layers are connected to the first padding layers through the second openings; forming a third insulating layer on a side of the second transparent part away from the second insulating layer, that the third insulating layer is patterned to form third openings in the first display area, and at least a portion of the second padding layers is exposed by the third openings; and forming a first electrode layer on a side of the third insulating layer away from the second transparent part, that the first electrode layer is patterned to form a plurality of first electrodes, and the plurality of first electrodes is connected to the second padding layers through the third openings.

Other aspects of the present disclosure can be understood by those skilled in the art in light of the description, the claims, and the drawings of the present disclosure.

BRIEF DESCRIPTION OF THE DRAWINGS

To more clearly illustrate the technical solution of the present disclosure, the accompanying drawings used in the description of the disclosed embodiments are briefly described hereinafter. The following drawings are merely examples for illustrative purposes according to various disclosed embodiments and are not intended to limit the scope of the present disclosure. Other drawings may be derived from such drawings by a person with ordinary skill in the art without creative efforts.

DETAILED DESCRIPTION

Figure 1:
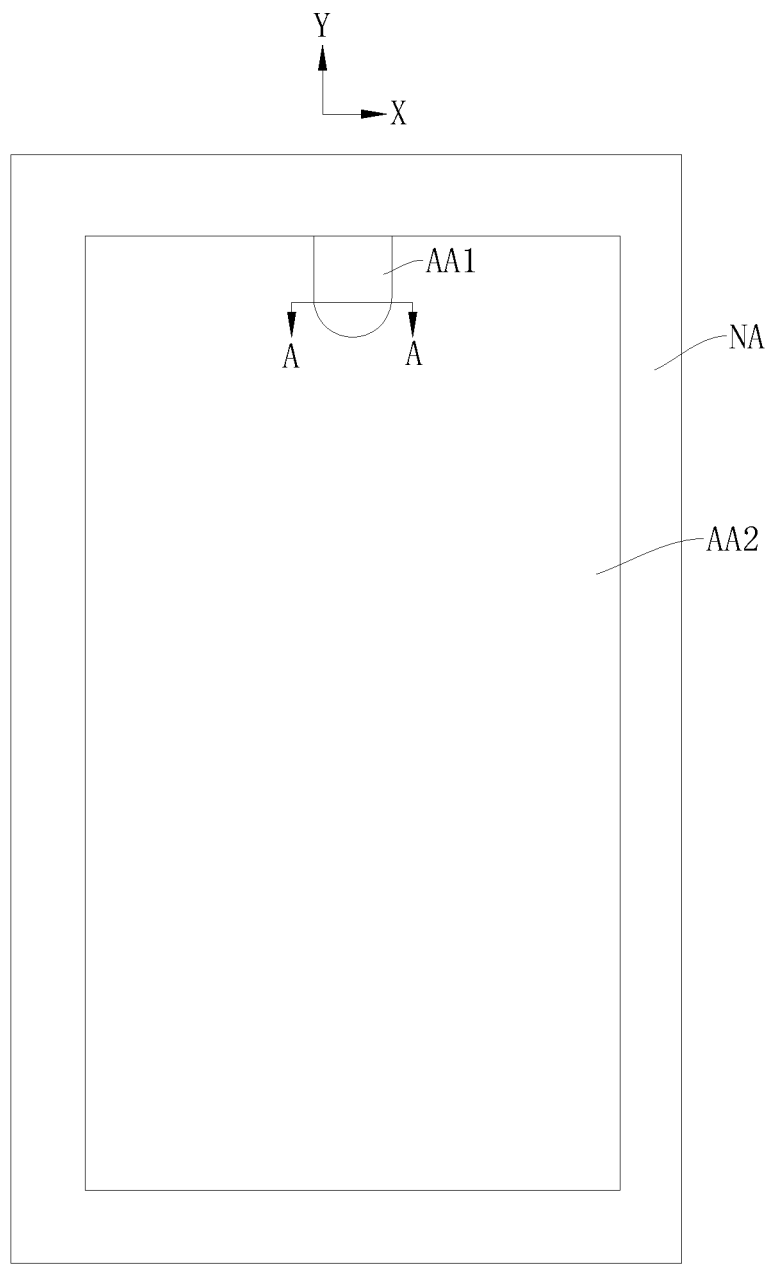
FIG. 1 is a schematic top view of an exemplary display panel according to various embodiments of the present disclosure.

Features and exemplary embodiments of various aspects of the present disclosure will be described in detail below. In the following detailed description, many alternative details are proposed to provide a comprehensive understanding of the present disclosure. However, it is understandable to those skilled in the art that the present disclosure can be implemented without some of these details. The following description of the embodiments is only to provide a better understanding of the present disclosure by showing examples of the present disclosure. In the drawings and the following description, at least part of well-known structures and technologies are not shown to avoid unnecessary blurring of the present disclosure; and, for clarity, sizes of some structures may be exaggerated. In addition, the features, structures or characteristics described below may be combined in any suitable manner in one or more embodiments.

In the description of the present disclosure, unless otherwise specified, "plurality" means two or more. Orientation or positional relationship indicated by terms such as "above", "below", "left", "right", "in", "out", etc., is only for convenience of describing the present disclosure and simplifying the description, rather than indicating or implying that a device or element referred to must have a specific orientation, and be constructed and operated in a specific orientation, and therefore cannot be understood as limitations to the present disclosure. In addition, terms "first", "second", etc., are only used for descriptive purposes, and cannot be understood as indicating or implying relative importance.

Orientation words appearing in the following description are all directions shown in the drawings, and do not limit structures of the embodiments of the present disclosure. In the description of the present disclosure, unless otherwise clearly defined and limited, terms "mounting" and "connection" should be understood in a broad sense, for example, it can be a fixed connection, or a detachable connection, or integrally connected; and it can be directly connected or indirectly connected. For a person with ordinary skill in the art, alternative meanings of the above-mentioned terms in the present disclosure can be understood according to actual circumstances.

In electronic devices such as mobile phones and tablet computers, it is necessary to integrate photosensitive components such as a front camera, an infrared light sensor, and a proximity light sensor on a side where a display panel is provided. In some embodiments, a light-transmitting display area may be provided on the above-mentioned electronic devices, the photosensitive components may be arranged on a back of the light-transmitting display area, and a full-screen display of the electronic devices can be realized while the photosensitive components are guaranteed to work normally.

To increase light transmittance of the light-transmitting display area, a transparent conductive part is arranged in the light-transmitting display area. For example, a transparent conductive part is arranged to connect pixel electrodes and transistors. Because the transparent conductive part is too close to the pixel electrodes and a common layer, when the common layer is etched and patterned by means such as lasers, it is very easy to damage the transparent conductive part, resulting in abnormal display of a display panel, which reduces yield of a display panel.

The present disclosure provides solutions to the above described technical problems. To better understand the present invention, display panel, display device, and fabrication method of the display panel according to the embodiments of the present disclosure will be described in detail below with reference to FIGS. 1-22.

FIG. 1 is a schematic top view of an exemplary display panel according to various embodiments of the present disclosure.

A display panel has a first display area AA1, a second display area AA2, and a non-display area NA surrounding the first display area AA1 and the second display area AA2. Light transmittance of the first display area AA1 is greater than that of the second display area AA2. In other optional embodiments, the display panel may not include the non-display area NA.

In the display panel according to the embodiments of the present disclosure, the light transmittance of the first display area AA1 is greater than the light transmittance of the second display area AA2, so that the display panel can be integrated with photosensitive components on a back of the first display area AA1, for example, to realize a photosensitive component of a camera being integrated under a screen. The first display area AA1 can display pictures at a same time, which increases a display area of the display panel and realizes a full-screen design of a display device.

In the display panel, there are many ways in which the light transmittance of the first display area AA1 is greater than that of the second display area AA2. For example, a pixel density (Pixels Per Inch, PPI) in the first display area AA1 is smaller than that in the second display area AA2, and a distance between two adjacent pixels in the first display area AA1 is larger to increase the light transmittance of the first display area AA1. Or a size of sub-pixels in the first display area AA1 is smaller, and the distance between two adjacent pixels can also be increased to increase the light transmittance of the first display area AA1.

In other alternative implementations, the light transmittance of at least a portion of a film in the first display area AA1 is higher, for example, the light transmittance of at least a portion of the film in the first display area AA1 is greater than 80%, even the light transmittance of at least a portion of a functional film is greater than 90%. Here, the light transmittance of the first display area AA1 is greater than or equal to 15%, and even greater than 40% or higher.

Figure 2:
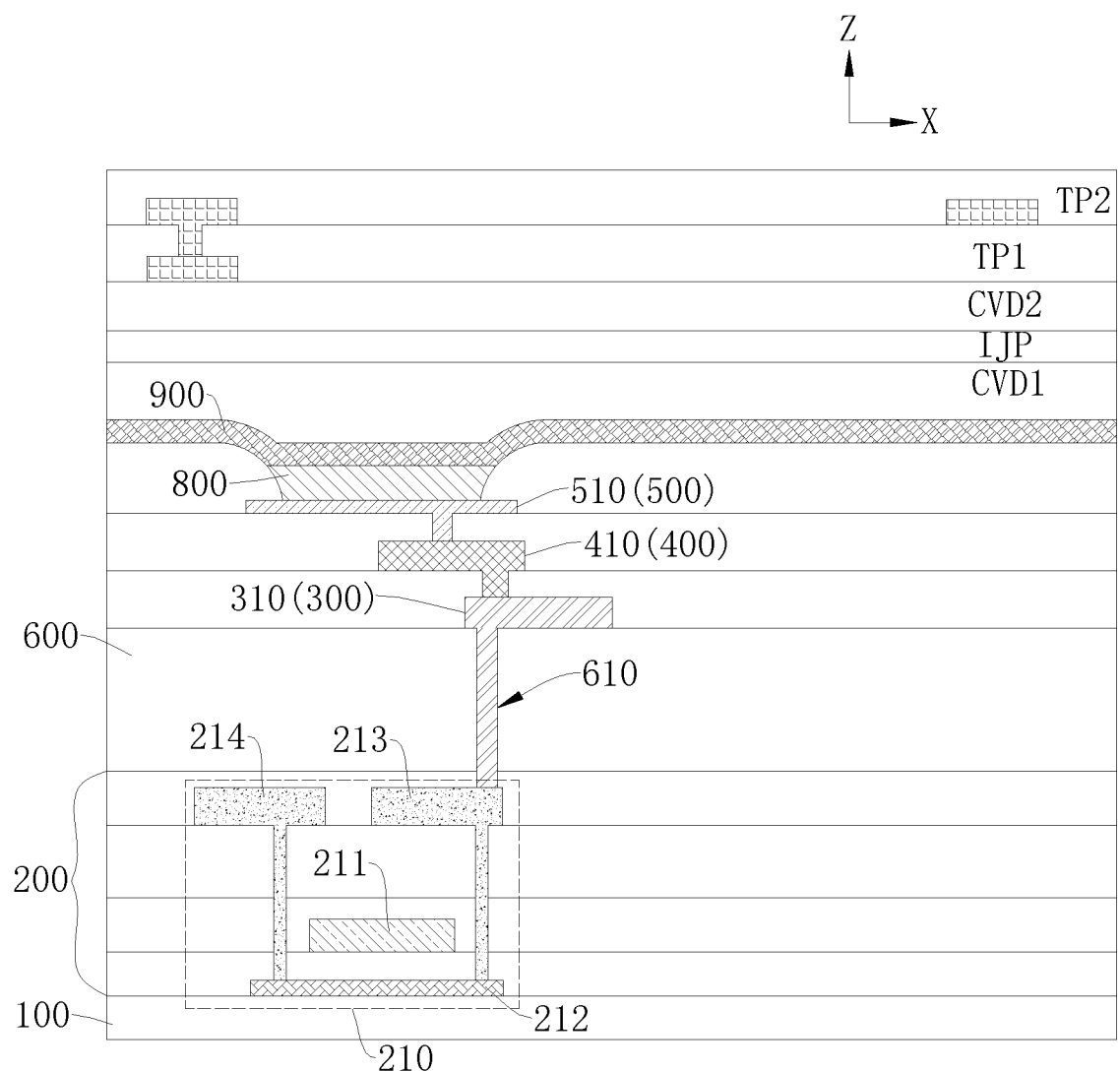
FIG. 2 is a partial cross-sectional view of A-A in FIG. 1 according to various embodiments of the present disclosure.

FIG. 2 is a partial cross-sectional view of A-A in FIG. 1 according to various embodiments of the present disclosure.

The display panel provided by the embodiments of the present disclosure includes: a substrate 100; a driving device layer 200, that the driving device layer 200 is located on one side of the substrate 100, and the driving device layer 200 includes a plurality of transistors 210; a first electrode layer 500, located in the first display area AA1, that the first electrode layer 500 is located on a side of the driving device layer 200 away from the substrate 100, and the first electrode layer 500 includes a plurality of first electrodes 510; a first transparent part 300, located in the first display area AA1, that the first transparent part 300 is located between the driving device layer 200 and the first electrode layer 500, and the first transparent part 300 includes first padding layers 310, which are electrically connected to the plurality of transistors 210; and a second transparent part 400, located in the first display area AA1, that the second transparent part 400 is located between the first transparent part and the plurality of first electrodes 510, and the second transparent part 400 includes second padding layers 410, which are used to connect the first padding layers 310, so that the plurality of transistors 210 can transmit signals to the plurality of first electrodes 510 through the first padding layers 310 and the second padding layers 410.

In the display panel provided by the embodiments of the present disclosure, the display panel has the first display area AA1 and the second display area AA2. The display panel includes the substrate 100, the driving device layer 200, the first electrode layer 500, the first transparent part 300, and the second transparent part 400. The first electrode layer 500, the first transparent part 300, and the second transparent part 400 are all located in the first display area AA1. The first transparent part 300 includes the first padding layers 310, and the second transparent part 400 includes the second padding layers 410. The first electrode layer 500 is connected to the plurality of transistors 210 through the first padding layers 310 and the second padding layers 410. That is, light transmittance of wires connected between the first electrode layer 500 and the plurality of transistors 210 is relatively high, which can effectively increase the light transmittance of the first display area AA1. When the display panel is provided with a photosensitive component in the first display area AA1, the photosensitive component is, for example, a camera, and the camera can obtain light through the first display area AA1. In addition, the plurality of first electrodes 510 are also provided in the first display area AA1, and the plurality of transistors 210 can drive the plurality of first electrodes 510 so that the first display area AA1 can display images, the display area of the display panel is increased, and a full-screen design is realized.

The display panel provided by the embodiments of the present disclosure is provided with the first transparent part 300 and the second transparent part 400 in the first display area AA1. During a fabrication process of the display panel, when a common layer is etched by a laser or other methods, since the second transparent part 400 is added, a distance between the common layer and the first transparent part 300 can be increased, and damage to the first transparent part 300 caused by the laser etching can be improved, thereby improving the yield of the display panel.

Optionally, the common layer includes a second electrode layer 900, and also includes an electron injection layer, an electron transport layer, a hole injection layer, a hole transport layer, and the like. To improve the light transmittance of the first display area AA1, the common layer is patterned by a laser, and a laser direction is directed from the common layer to a side of the driving device layer.

The first transparent part 300 and the second transparent part 400 are made of indium tin oxide (ITO) or indium zinc oxide, etc., to increase light transmittance of the first transparent part 300 and the second transparent part 400, and ensure that the first transparent part 300 and the second transparent part 400 have conductive properties.

Optionally, the display panel further includes a light-emitting layer 800 and the second electrode layer 900. The light-emitting layer 800 is located on a side of the first electrode layer 500 away from the driving device layer 200, and the second electrode layer 900 is located on a side of the light-emitting layer 800 away from the first electrode layer 500. The light-emitting layer 800 includes a plurality of light-emitting structures distributed in an array. The first electrode layer 500 is a pixel electrode layer, and the second electrode layer 900 is a common electrode layer. Interaction of the first electrode layer 500 and the second electrode layer 900 excites a light-emitting material in the plurality of light-emitting structures to emit light.

The display panel may also include an encapsulation layer, a touch layer, a polarizer, a glass cover, etc., which are located on a side of the second electrode layer 900 away from the light-emitting layer 800.

A transistor 210 is, for example, a thin film transistor. The transistor 210 includes a gate 211, a semiconductor layer 212, and a source and drain electrode layer. An inter-gate insulating layer is provided between the gate 211 and the semiconductor layer 212. The source and drain electrode layer includes a source electrode 213 and a drain electrode 214, and a metal pad layer 710 is connected to the source electrode 213 or the drain electrode 214. For example, an insulating layer between a metal conductive layer 700 and the source and drain electrode layer is provided with via-holes, and the metal pad layer 710 is connected to the source electrode 213 or the drain electrode 214 via the via-holes. The thin film transistor is, for example, a top-gate thin film transistor.

There are many ways to set up a driving circuit of the display panel. The driving circuit of the display panel can be any of a 2T1C circuit, a 7T1C circuit, a 7T2C circuit, or a 9T1C circuit. In this article, the "2T1C circuit" refers to a pixel circuit that includes two thin film transistors (T) and one capacitor (C) in the pixel circuit. The other "7T1C circuit", "7T2C circuit", "9T1C circuit" and so on are analogous to this.

Figure 3:
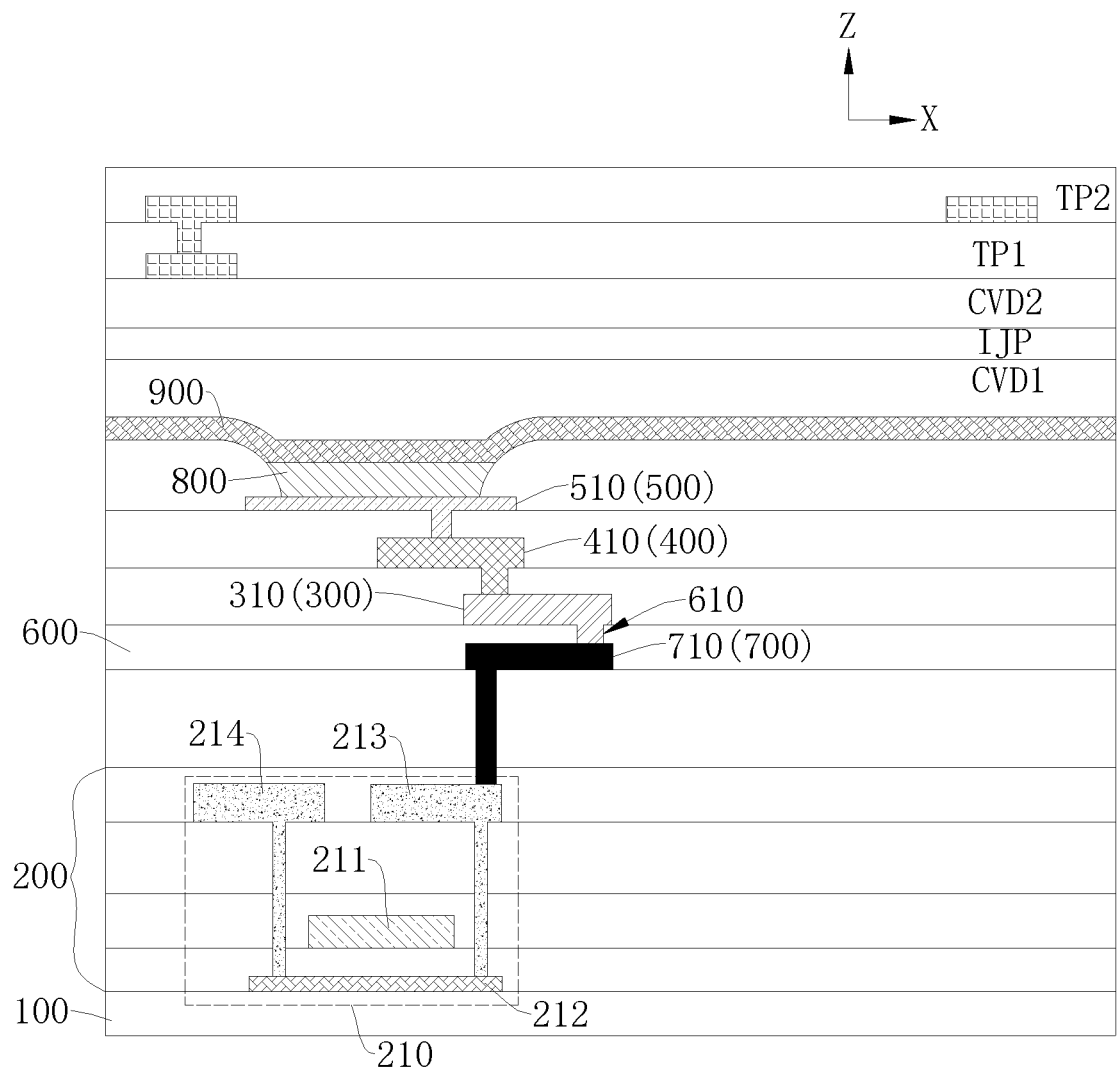
FIG. 3 is a partial cross-sectional view of A-A in FIG. 1 according to various embodiments of the present disclosure.

FIG. 3 is a cross-sectional view of A-A in FIG. 1 according to various embodiments of the present disclosure.

Optionally, the display panel further includes the metal conductive layer 700 disposed between the driving device layer 200 and the first transparent part 300. The metal conductive layer 700 includes the metal pad layer 710, which is connected to the first padding layers 310 and the plurality of transistors 210. The first padding layers 310 are connected to the plurality of transistors 210 through the metal pad layer 710, and the connection between the metal pad layer 710 and the plurality of transistors 210 is more stable, which can improve the yield of the display panel.

In some optional embodiments, an orthographic projection of the metal pad layer 710 on the substrate 100 and an orthographic projection of the plurality of transistors 210 on the substrate 100 at least partially overlap with each other. The metal pad layer 710 can shield at least a portion of the plurality of transistors 210.

During a use of the display panel, when the display panel emits light, due to shielding effect of the metal pad layer 710, self-luminescence of the display panel can be reduced to affect operation of the plurality of transistors 210. In addition, the orthographic projection of the metal pad layer 710 on the substrate 100 and the orthographic projection of the plurality of transistors 210 on the substrate 100 at least partially overlap with each other, which can increase the light transmittance of the display panel.

In some optional embodiments, the display panel further includes a first electrode plate and a second electrode plate for forming a capacitor. The first electrode plate can be, for example, a metal in a same layer as data lines and scan lines, and the second electrode plate has a power supply potential, for example.

Optionally, continuing to refer to FIG. 2, the display panel further includes a planarization layer, that the planarization layer may be formed of an insulating material, so that the planarization layer can play an insulating function. At least one of the source and drain electrode layer, the metal conductive layer 700, the first transparent part 300, and the second transparent part 400, is provided with the planarization layer on one side away from the substrate 100.

Figure 4:
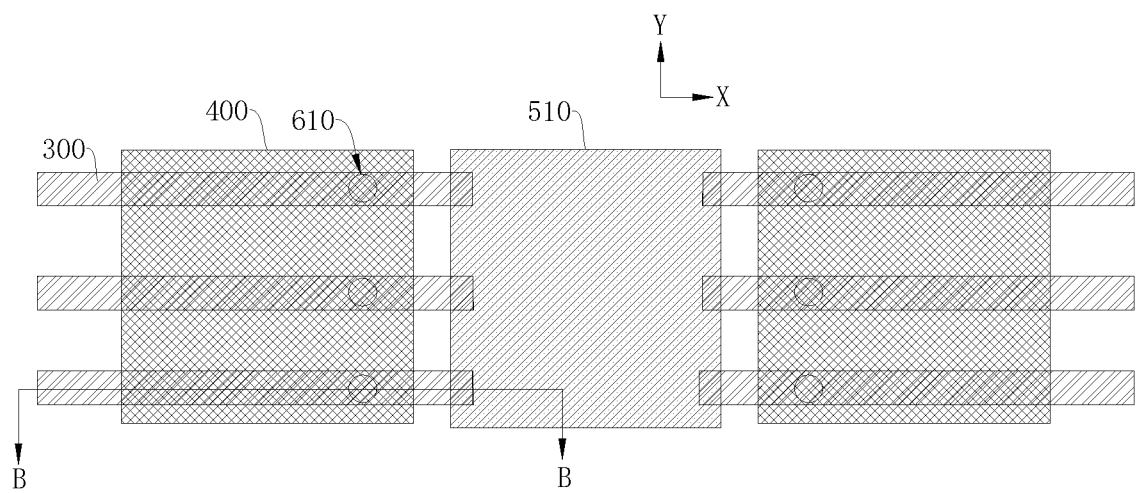
FIG. 4 is a schematic view of a partial layer structure of an exemplary display panel according to various embodiments of the present disclosure.
Figure 5:
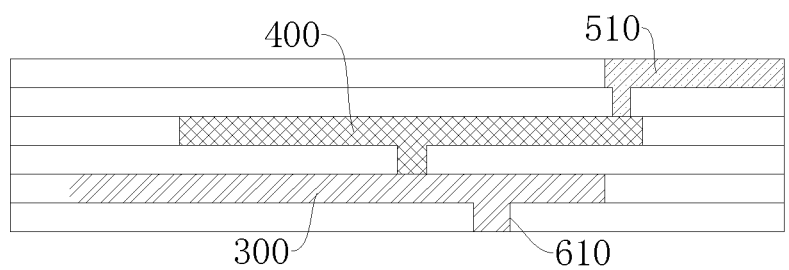
FIG. 5 is a partial cross-sectional view of B-B in FIG. 4.

Referring to FIG. 4 and FIG. 5 together, FIG. 4 is a schematic view of a partial layer structure of an exemplary display panel according to various embodiments of the present disclosure, and FIG. 5 is a cross-sectional view of B-B in FIG. 4. To better show a relative positional relationship between various layers in the display panel provided by the embodiments of the present disclosure, FIG. 4 and FIG. 5 show a positional relationship of portions of the first transparent part 300, the second transparent part 400, and the plurality of first electrodes 510.

Optionally, in the display panel provided by the embodiments of the present disclosure, an area of a second orthographic projection of the second transparent part 400 on the substrate 100 is larger than an area of a first orthographic projection of the first transparent part 300 on the substrate 100, and at least a portion of the first orthographic projection is within the second orthographic projection.

In some alternative embodiments, the area of the second orthographic projection is larger than the area of the first orthographic projection, and at least a portion of the first orthographic projection is within the second orthographic projection, that is, the second transparent part 400 covers at least a portion of the first transparent part 300.

During the fabrication process of the display panel, formation of layer structures on a side of the second transparent part 400 away from the first transparent part 300 may involve patterning. For example, during a formation process of the second electrode layer 900, the second electrode layer 900 needs to be patterned. For example, when a technique such as a laser is used to pattern the second electrode layer 900, the laser irradiates from a side of the second electrode layer 900 away from the substrate 100. The laser may reach the second transparent part 400 through the second electrode layer 900, or reach the second transparent part 400 and the first transparent part 300, which may cause the first transparent part 300 to experience excessive exposure and disconnection, thereby affecting signal transmission and the yield of the display panel.

In the embodiments of the present disclosure, the second transparent part 400 covers at least a portion of the first transparent part 300. Due to shielding of the second transparent part 400, the second transparent part 400 can provide protection to the first transparent part 300 and reduce an amount of laser light reaching the first transparent part 300, thereby improving the damage to the first transparent part 300 caused by laser etching and improving the yield of the display panel.

Optionally, referring to FIGS. 2 and 3 together, the display panel further includes a first insulating layer 600. The first insulating layer 600 is located between the first transparent part 300 and the driving device layer 200, and the first insulating layer 600 is provided with first via-holes 610. The first padding layers 310 are connected to the plurality of transistors 210 through the first via-holes 610, and an orthographic projection of the first via-holes 610 on the substrate 100 is located within the second orthographic projection.

In some alternative embodiments, structures of the first padding layers 310 located in the first via-holes 610 are usually small, and the first padding layers 310 are easily broken if the first padding layers 310 located in the first via-holes are subjected to the laser. The orthographic projection of the first via-holes 610 on the substrate 100 is within the second orthographic projection, that is, the second padding layers 410 cover the first padding layers 310 in the first via-holes 610.

As mentioned above, when using laser technology to pattern the common layer, when the laser is emitted from a side of the first electrode layer 500 or the light-emitting layer 800 away from the second padding layers 410 to the second padding layers 410, the second padding layers 410 can provide protection to the first padding layers 310 located in the first via-holes 610, reduce an amount of laser light reaching positions of the first via-holes 610, thereby improving the damage to the first padding layers 310 caused by laser etching and improving the yield of the display panel.

Optionally, when the display panel includes the metal conductive layer 700, and the first padding layers 310 and the metal pad layer 710 of the metal conductive layer 700 are connected to each other, the first insulating layer 600 may be disposed between the first transparent part 300 and the metal conductive layer 700.

Figure 6:
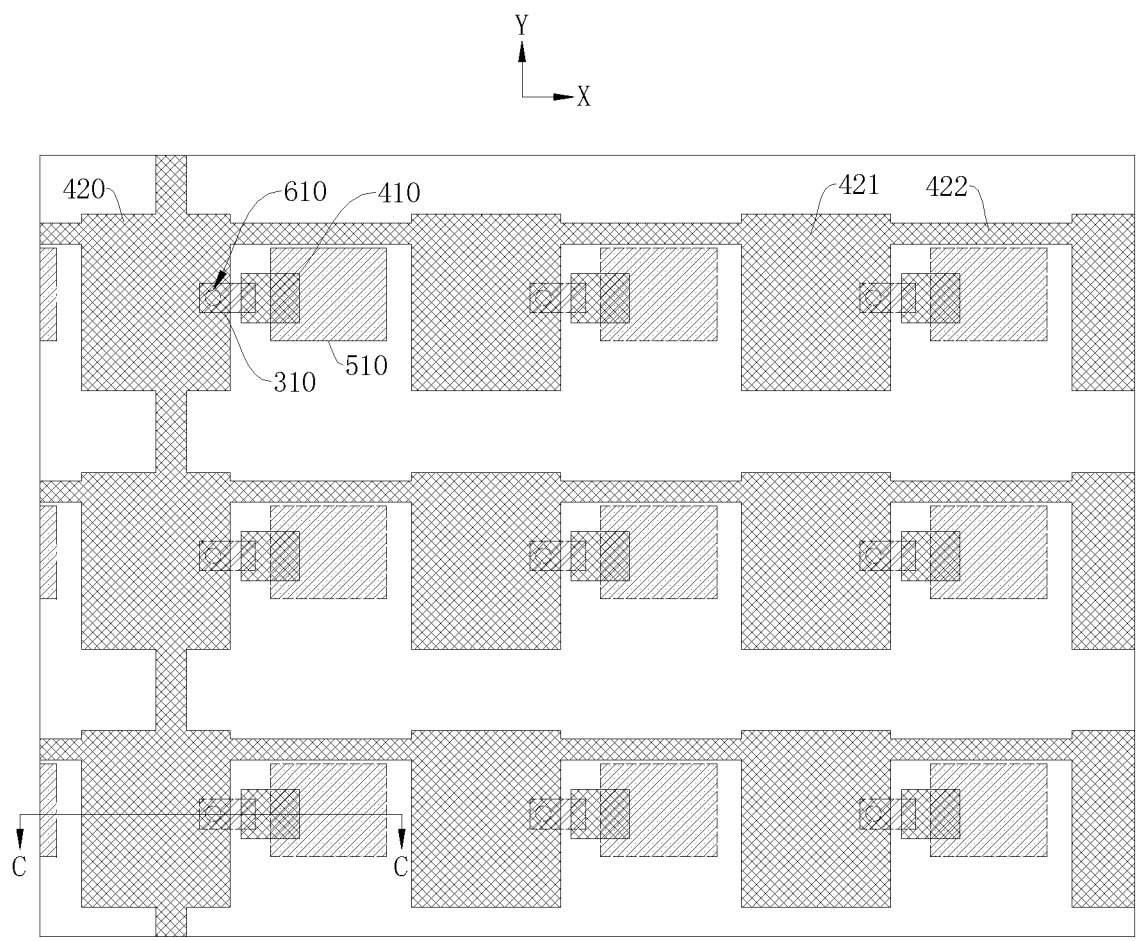
FIG. 6 is a schematic view of a partial layer structure of an exemplary display panel according to various embodiments of the present disclosure.
Figure 7:
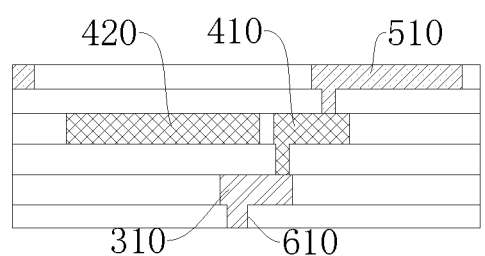
FIG. 7 is a partial cross-sectional view of C-C in FIG. 6.

Referring to FIG. 6 and FIG. 7 together, FIG. 6 is a schematic view of a partial layer structure of an exemplary display panel according to various embodiments of the present disclosure, and FIG. 7 is a partial cross-sectional view of C-C in FIG. 6.

Optionally, in the display panel provided by the embodiments of the present disclosure, in addition to the second padding layers 410 provided in the second transparent part 400, other conductive wires may be provided in the second transparent part 400. In some optional embodiments, the second transparent part 400 further includes a power supply wire 420, and at least a portion of the orthographic projection of the first padding layers 310 on the substrate 100 is located within an orthographic projection of the power supply wire 420 on the substrate 100.

In some alternative embodiments, the second transparent part 400 includes the power supply wire 420, and an area of the power supply wire 420 can be arranged relatively large. At least a portion of the orthographic projection of the first padding layers 310 on the substrate 100 is located within the orthographic projection of the power supply wire 420 on the substrate 100, so that the power supply wire 420 can cover the first padding layers 310 and provide protection to the first padding layers 310, thereby improving the damage to the first padding layers 310 caused by laser etching and improving the yield of the display panel.

It is understandable that the second padding layers 410 and the first padding layers 310 need to be connected to each other, so the second padding layers 410 and the first padding layers 310 at least partially overlap with each other in a Z direction, that is, the orthographic projection of the second padding layers 410 on the substrate 100 and the orthographic projection of the first padding layers 310 on the substrate 100 at least partially overlap with each other. The second padding layers 410 and the power supply wire 420 are arranged independently of each other, so at least a portion of the first padding layers 310 is protected by the power supply wire 420, and another portion of the first padding layers 310 is protected by the second padding layers 410. Better protection can be provided to the first transparent part 300, through the second padding layers 410 and the power supply wire 420.

Figure 8:
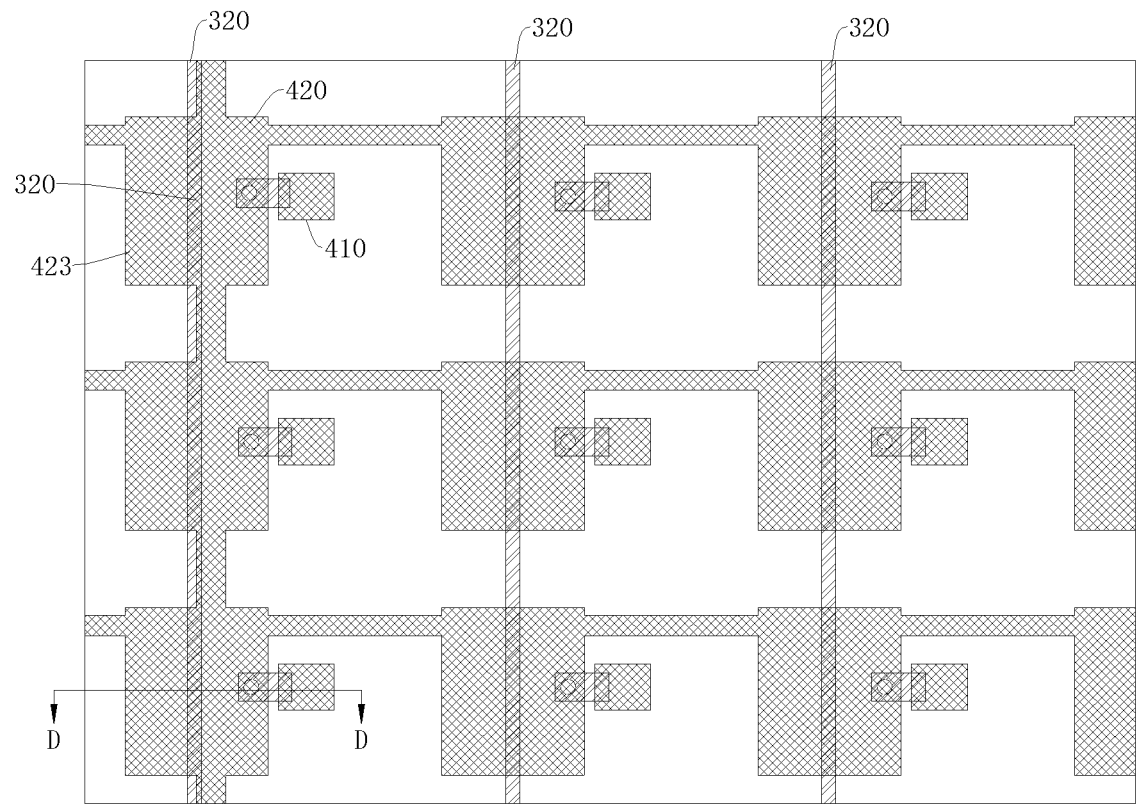
FIG. 8 is a schematic view of a partial layer structure of an exemplary display panel according to various embodiments of the present disclosure.
Figure 9:
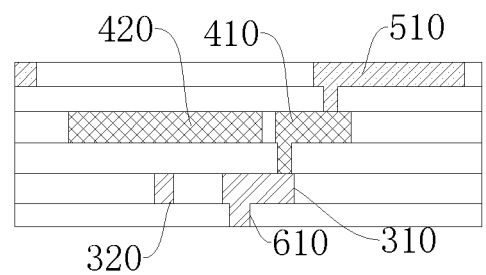
FIG. 9 is a partial cross-sectional view of D-D in FIG. 8.

Referring to FIG. 8 and FIG. 9 together, FIG. 8 is a schematic view of a partial layer structure of an exemplary display panel according to various embodiments of the present disclosure, and FIG. 9 is a cross-sectional view of D-D in FIG. 8.

In the display panel provided by the embodiments of the present disclosure, the first transparent part 300 further includes voltage reference lines 320. The orthographic projection of the power supply wire 420 on the substrate 100 and an orthographic projection of the voltage reference lines 320 on the substrate 100 at least partially overlap with each other. At least a portion of the voltage reference lines 320 is covered by the power supply wire 420.

As described above, during the fabrication process of the display panel, when a technique such as a laser is used to pattern the common layer, the laser irradiates from the side of the common layer away from the substrate 100. The laser may reach the power supply wire 420 through the common layer 900, or reach the power supply wire 420 and the voltage reference lines 320.

In the display panel provided by the embodiments of the present disclosure, since a distribution area of the power supply wire 420 can be set to be relatively large, even if a portion of the laser light reaches the power supply wire 420, so that a portion of the power supply wire 420 is excessively exposed, rest of the power supply wire 420 will still be connected to each other, signal transmission of the power supply wire 420 will not be affected. The power supply wire 420 covers at least a portion of the voltage reference lines 320, that is, the power supply wire 420 shields at least a portion of the voltage reference lines 320. Through shielding effect of the power supply wire 420, an amount of the laser light reaching the voltage reference lines 320 can be reduced, thereby improving damage to the voltage reference lines 320 caused by the laser and improving the yield of the display panel.

In other embodiments, the voltage reference lines 320 may also be provided on the driving device layer 200.

Since the power supply wire 420 and the voltage reference lines 320 both have fixed potentials, the potentials remain unchanged, even if there is an overlapping area between the power supply wire 420 and the voltage reference lines 320, coupling capacitance between the power supply wire 420 and the voltage reference lines 320 is small, and will not affect the display of the display panel.

There are many ways to set the area where the orthographic projection of the power supply wire 420 on the substrate 100 and the orthographic projection of the voltage reference lines 320 on the substrate 100 overlap with each other, as long as the orthographic projection of the power supply wire 420 on the substrate 100 and the orthographic projection of the voltage reference lines 320 on the substrate 100 at least partially overlap with each other, so that the power supply wire can provide protection to the voltage reference lines 320.

Optionally, an overlapping area of the orthographic projection of the power supply wire 420 on the substrate 100 and the orthographic projection of the voltage reference lines 320 on the substrate 100 is S, and an orthographic projection area of the voltage reference lines 320 on the substrate 100 is S1, where $S \geq 60\% * S1$. The overlapping area S is large enough, and the area of the voltage reference lines 320 covered by the power supply wire 420 is large enough. When the laser is emitted from the side of the power supply wire 420 away from the voltage reference lines 320 to the power supply wire 420, due to the shielding effect of the power supply wire 420, the power supply wire 420 can provide sufficient protection to the voltage reference lines 320.

Figure 10:
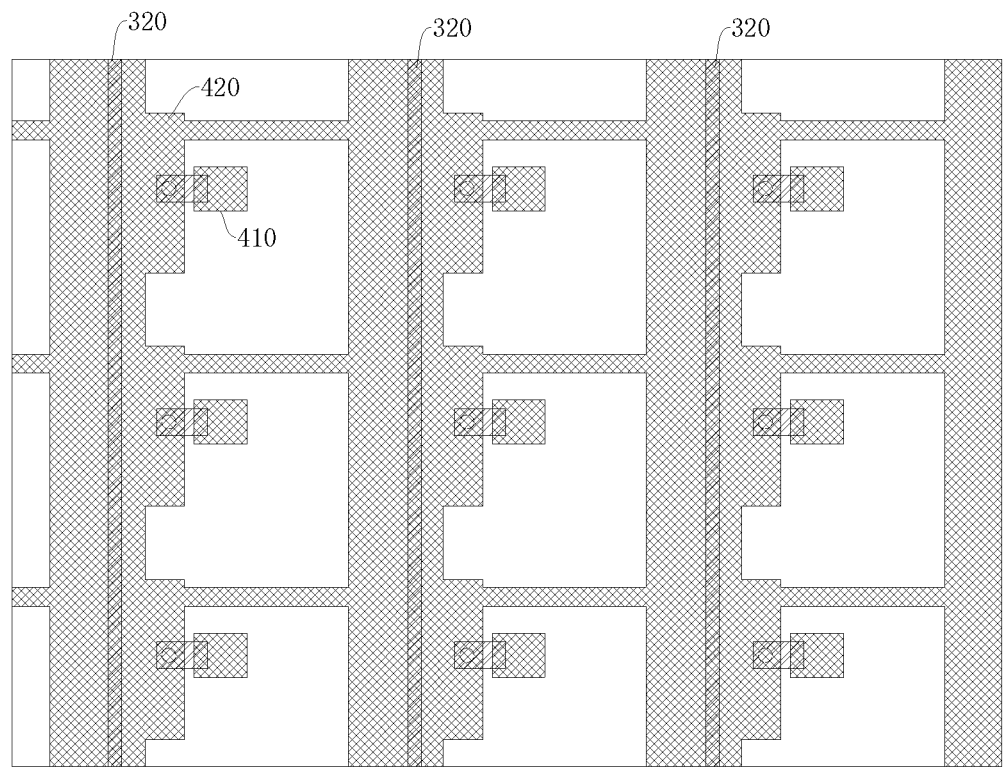
FIG. 10 is a schematic view of a partial layer structure of an exemplary display panel according to various embodiments of the present disclosure.

Optionally, referring to FIG. 10 together, FIG. 10 is a schematic view of a partial layer structure of an exemplary display panel according to various embodiments of the present disclosure. A difference between FIG. 10 and FIG. 8 is that the orthographic projection of the voltage reference lines 320 on the substrate 100 is located within the orthographic projection of the power supply wire 420 on the substrate 100, that is, S=S1, and the voltage reference lines 320 are completely covered by the power supply wire 420. When the laser is emitted from the side of the power supply wire 420 away from the voltage reference lines 320 to the power supply wire 420, due to the shielding effect of the power supply wire 420, the power supply wire 420 can provide sufficient protection to the voltage reference lines 320.

Figure 11:
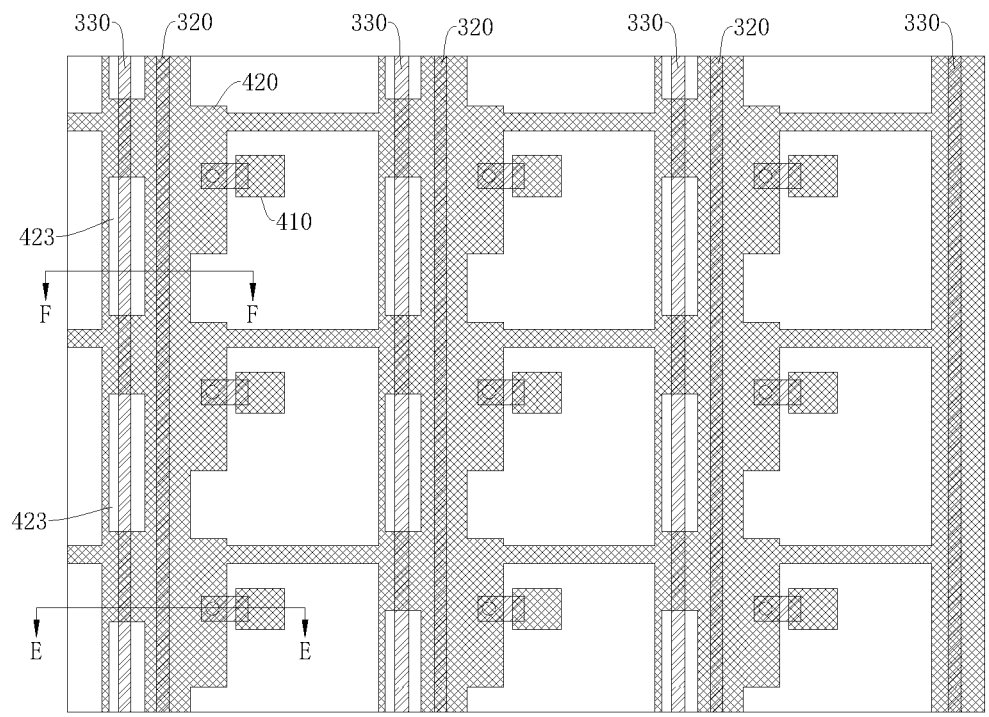
FIG. 11 is a schematic view of a partial layer structure of an exemplary display panel according to various embodiments of the present disclosure.
Figure 12:
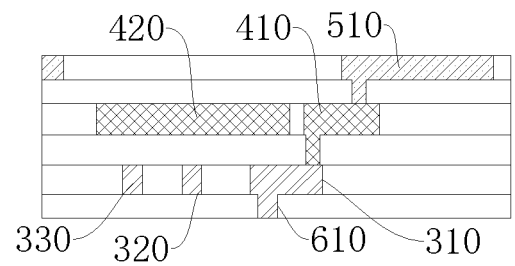
FIG. 12 is a partial cross-sectional view of E-E in FIG. 11.

Referring to FIG. 11 and FIG. 12 together, FIG. 11 is a schematic view of a partial layer structure of an exemplary display panel according to various embodiments the present disclosure, and FIG. 12 is a cross-sectional view of E-E in FIG. 11.

In some optional embodiments, the display panel further includes signal lines 330 disposed in the first transparent part 300.

In other optional embodiments, the signal lines 330 may also be disposed on the driving device layer 200.

Figure 13:
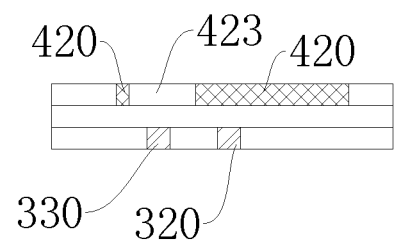
FIG. 13 is a partial cross-sectional view of F-F in FIG. 11 according to various embodiments of the present disclosure.

Referring to FIG. 13 together, FIG. 13 is a partial cross-sectional view of F-F in FIG. 11 according to various embodiments of the present disclosure.

In some embodiments, the first transparent part 300 includes the signal lines 330, which provide electrical signals for the plurality of transistors 210, and the power supply wire 420 includes openings, and the openings are filled with insulating filling portions 423. An orthographic projection of the insulating filling portions 423 on the substrate 100 covers at least a portion of the signal lines 330. Optionally, the signal lines 330 may be the data lines or the scan lines.

In some alternative embodiments, the first transparent part 300 includes the signal lines 330, that is, the signal lines 330 have a certain light transmittance, which can further increase the light transmittance of the first display area AA1. However, a distance between the signal lines 330 and the second transparent part 400 is relatively small, and the signal lines 330 are not at a fixed potential, so a coupling capacitor is easily formed between the signal lines 330 and the second transparent part 400 to affect the display of the display panel.

In the embodiments provided by the present disclosure, the orthographic projection of the insulating filling portions 423 on the substrate 100 covers at least a portion of the signal lines 330, which can reduce an overlapping area between a conductive portion on the second transparent part 400 and the signal lines 330, thereby reducing coupling capacitance to improve effect on the display of the display panel due to the capacitance between the first transparent part 300 and the second transparent part 400.

There are many ways to arrange the insulating filling portions 423, which are optional. Continuing to refer to FIG. 13, the insulating filling portions 423 are adapted to a size of the openings, and the insulating filling portions 423 and the power supply wire 420 are arranged with a same thickness.

Figure 14:
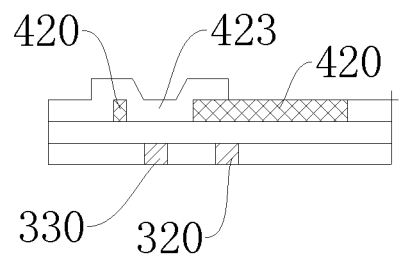
FIG. 14 is a partial cross-sectional view of F-F in FIG. 11 according to various embodiments of the present disclosure.

In other alternative embodiments, referring to FIG. 14 together, FIG. 14 is a cross-sectional view of F-F in FIG. 11 according to various embodiments of the present disclosure.

The insulating filling portions 423 are disposed over the openings, and at least a portion of the insulating filling portions 423 is located on the side of the power supply wire 420 away from the substrate 100. That is, a portion of the insulating filling portions 423 and the power supply wire 420 overlap with each other.

The signal lines 330 are the data lines or the scan lines. The potential of the signal lines 330 varies greatly, and magnetic field lines generated by the signal lines 330 may emerge from the openings (that is, positions where the insulating filling portions 423 are located) to the power supply wire 420, so that there is coupling capacitance between the power supply wire 420 and the signal lines 330.

In the display panel provided by the embodiments of the present disclosure, at least a portion of the insulating filling portions 423 is located on the side of the power supply wire 420 away from the substrate 100. On one hand, process difficulty can be reduced. After a portion of the insulating filling portions 423 overflows the openings, there is no need to reprocess the overflowing portion of the insulating filling portions 423, which can improve fabrication efficiency of the display panel. On another hand, the insulating filling portions 423 cover a portion of the power supply wire 420, and the insulating filling portions 423 cover a portion of the power supply wire 420 close to the openings, which can reduce electric field lines generated by the signal lines 330 from the openings to the power supply wire 420 and reduce the coupling capacitance.

In addition, by providing the insulating filling portions 423 on the second transparent part 400, the insulating filling portions 423 can be made of an organic material with a low dielectric constant, so that the organic material is located between the signal lines 330 and the power supply wire 420, which can reduce the coupling capacitance between the signal lines 330 and the power supply wire 420, thereby reducing influence of the coupling capacitance on transmission signals of the signal lines 330 and improving display uniformity of the display panel.

Optionally, in other embodiments, when both the voltage reference lines 320 and the signal lines 330 are provided in the first transparent part 300, the orthographic projection of the insulating filling portions 423 on the substrate 100 and the orthographic projection of the voltage reference lines 320 on the substrate 100 at least partially overlap with each other. The insulating filling portions 423 can not only provide protection to the voltage reference lines 320, but also reduce an overlapping area between the power supply wire 420 and the reference voltage lines, thereby reducing coupling capacitance.

In other optional embodiments, an installation size of the insulating filling portions 423 is small, and the orthographic projection of the insulating filling portions 423 on the substrate 100 and the orthographic projection of the voltage reference lines 320 on the substrate 100 do not overlap with each other, so as to improve electrical conductivity of the power supply.

There are many ways to arrange the power supply wire 420, for example, the power supply wire 420 extends in a first direction (an X direction in FIG. 1) or a second direction (a Y direction in FIG. 1).

In some alternative embodiments, continuing to refer to FIG. 6, the power supply wire 420 includes a plurality of power supply blocks 421 and a plurality of connecting leads 422 for connecting to the plurality of power supply blocks 421. An orthographic projection of each power supply block 421 on the substrate 100 is located between orthographic projections of two adjacent first electrodes 510 on the substrate 100, and orthographic projections of the plurality of connecting leads 422 on the substrate 100 and orthographic projections of the plurality of first electrodes 510 on the substrate 100 are arranged in an offset manner.

In some alternative embodiments, the power supply wire 420 includes the plurality of power supply blocks 421 and the plurality of connecting leads 422. On one hand, the plurality of power supply blocks 421 can ensure the distribution area of the power supply wire 420, which not only enables the power supply wire 420 to provide better protection to the first transparent part 300, but also reduces resistance and voltage drop of the power supply wire 420 to ensure that there is a large enough potential on one plate of a capacitor to improve a crosstalk problem of the display panel. On another hand, the second transparent part 400 further includes the second padding layers 410, and the second padding layers 410 and the plurality of first electrodes 510 are arranged in a one-to-one correspondence. Each power supply block 421 is located between two adjacent second padding layers 410, and the plurality of connecting leads 422 and the second padding layers 410 are arranged in a staggered manner. A size of the plurality of connecting leads 422 is small, which can increase a distance between them and the second padding layers 410, thereby ensuring insulation performance between the power supply wire 420 and the second padding layers 410. In addition, a small distribution area of the plurality of connecting leads 422 can also increase the light transmittance of the second transparent part 400.

Since the plurality of power supply blocks 421 is related to arrangement of the plurality of first electrodes 510 and the plurality of first electrodes 510 is related to arrangement of the light-emitting structures in the light-emitting layer 800, the plurality of power supply blocks 421 is related to arrangement of sub-pixels in the display panel.

As shown in FIG. 6, when the sub-pixels in the display panel are sequentially arranged along the X direction and the Y direction, that is, when the plurality of first electrodes 510 is sequentially arranged along the X direction and the Y direction, the plurality of power supply blocks 421 is sequentially arranged along the X direction and the Y direction.

Figure 15:
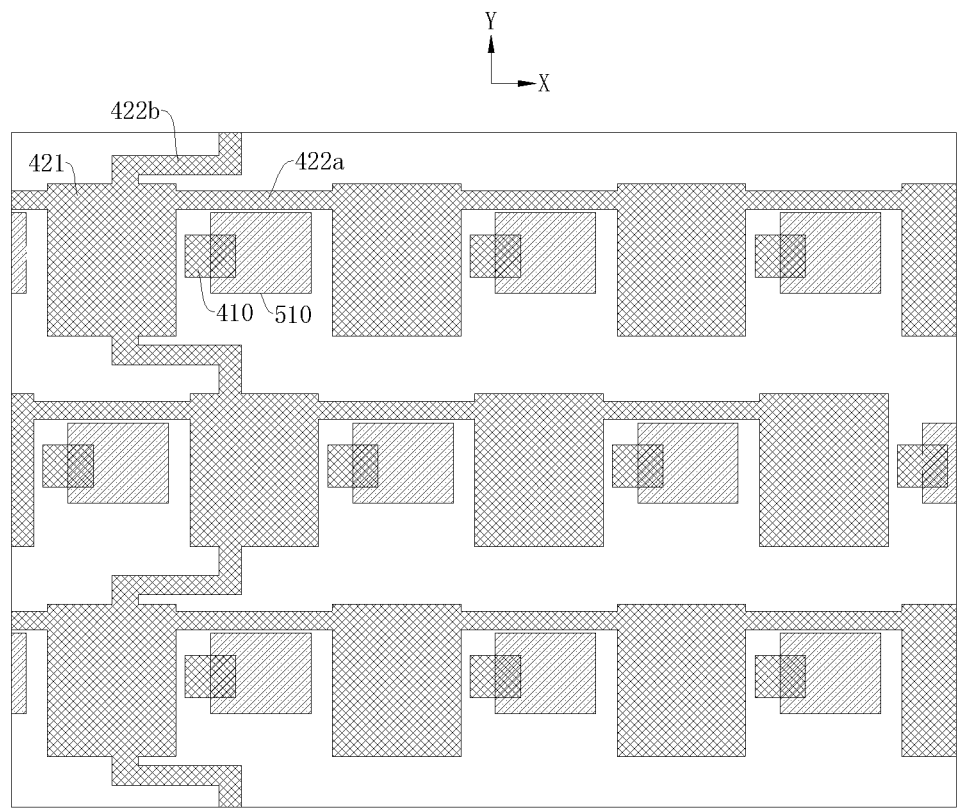
FIG. 15 is a top view of a second transparent part of an exemplary display panel according to various embodiments of the present disclosure.

Referring to FIG. 15, FIG. 15 is a schematic structural view of a second transparent part of an exemplary display panel according to various embodiments of the present disclosure. A difference between FIG. 15 and FIG. 6 lies in the arrangement of the plurality of first electrodes 510. When two adjacent rows of the sub-pixels in the Y direction are staggered, that is, when two adjacent rows of the plurality of first electrodes 510 are staggered in the Y direction, two adjacent rows of the plurality of power supply blocks 421 are staggered in the Y direction.

Optionally, the plurality of power supply blocks 421 are arranged in rows and columns along the X direction and the Y direction. The plurality of connecting leads 422 includes first connecting leads 422a and second connecting leads 422b, and any two power supply blocks 421 adjacent in the X direction are connected to each other through a first connecting lead 422a. Among two rows of power supply blocks 421 adjacent in the Y direction, one or more groups of two power supply blocks 421 adjacent in the Y direction are connected to each other through a second connecting lead 422b.

Figure 16:
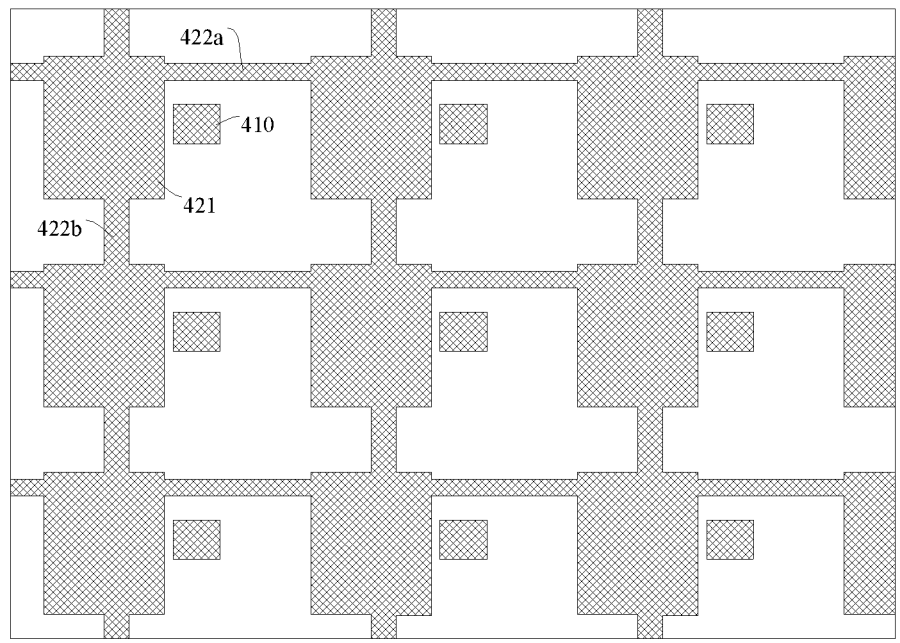
FIG. 16 is a schematic structural view of a second transparent part of an exemplary display panel according to various embodiments of the present disclosure.

For example, Referring to FIG. 16, FIG. 16 is a schematic structural view of a second transparent part of an exemplary display panel according to various embodiments of the present disclosure. Optionally, any two adjacent power supply blocks 421 in the Y direction are connected to each other through the second connecting lead 422b. Among them, two adjacent power supply blocks 421 in the Y direction are a group.

In some alternative embodiments, any two adjacent power supply blocks 421 in the X direction and any two adjacent power supply blocks 421 in the Y direction are connected to each other through a connecting lead 422, which can increase a size of an interconnection area between the plurality of power supply blocks 421, thereby increasing the distribution area of the entire power supply wire 420 and reducing the resistance and voltage drop in the power supply wire 420.

Figure 17:
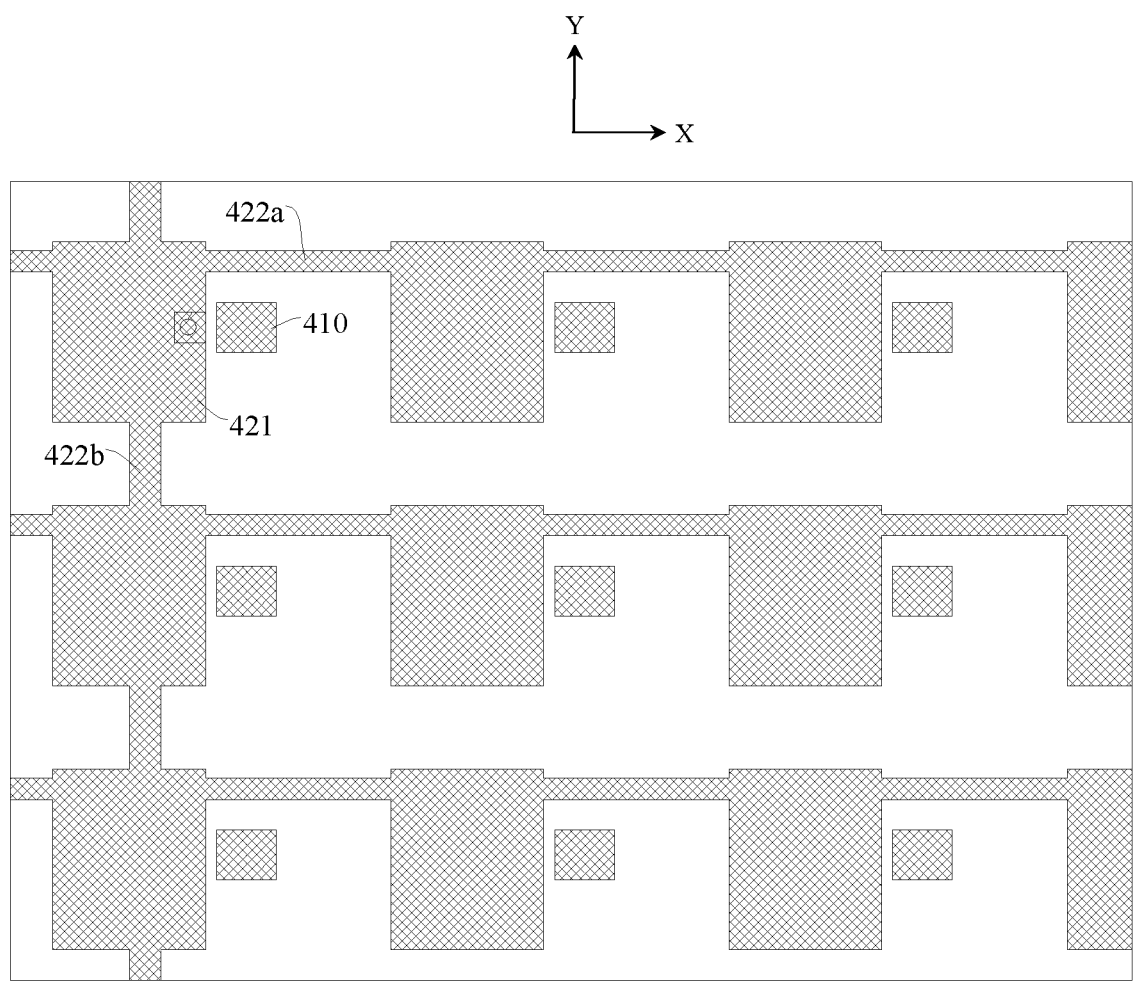
FIG. 17 is a schematic structural view of a second transparent part of an exemplary display panel according to various embodiments of the present disclosure.

Alternatively, Referring to FIG. 17, FIG. 17 is a schematic structural view of a second transparent part of an exemplary display panel according to various embodiments of the present disclosure.

In some other alternative embodiments, any two power supply blocks 421 adjacent in the X direction are connected to each other through the first connecting lead 422a. Among the two rows of power supply blocks 421 adjacent in the Y direction, one group of power supply blocks 421 adjacent in the Y direction are connected to each other through the second connecting lead 422b.

In some alternative embodiments, since any two power supply blocks 421 adjacent in the X direction are connected to each other through the first connecting lead 422a, so long as a group of power supply blocks 421 adjacent in the Y direction are connected to each other through the second connecting lead 422b, the plurality of power supply blocks 421 can be interconnected with each other.

In addition, a group of power supply blocks 421 adjacent in the Y direction are connected to each other through the second connecting lead 422b, which can simplify a distribution pattern of the power supply wire 420, and facilitate formation of the power supply wire 420 by etching or other patterning processes, thereby improving production efficiency of the power supply wire 420. By setting a group of power supply blocks 421 adjacent in the second direction to be connected to each other through the second connecting lead 422b, a distribution area of the second connecting lead 422b is reduced and the light transmittance of the second transparent part 400 is increased.

Figure 18:
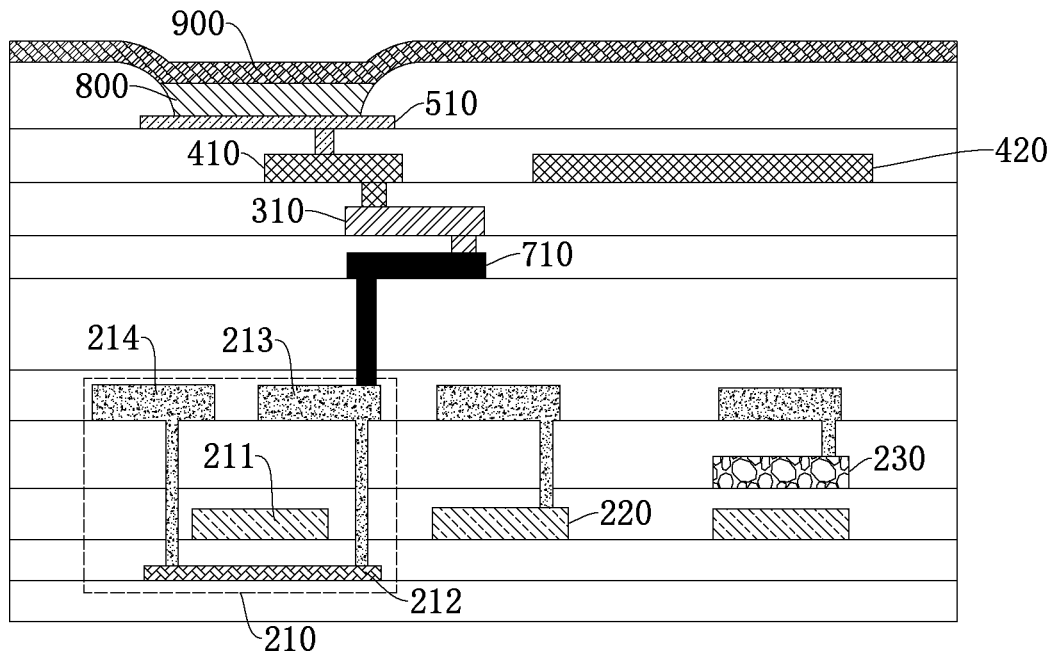
FIG. 18 is a cross-sectional view of A-A of FIG. 1 according to various embodiments of the present disclosure.

In some other embodiments, referring to FIG. 18 together, FIG. 18 is a cross-sectional view of A-A in FIG. 1 according to various embodiments of the present disclosure.

The driving device layer 200 further includes first signal lines 220, the first signal lines 220 provide signals for the plurality of transistors 210, and the orthographic projection of the power supply wire 420 on the substrate 100 and an orthographic projection of the first signal lines 220 on the substrate 100 at least partially overlap with each other.

In some alternative embodiments, the first signal lines 220 are disposed on the driving device layer 200, and a distance between the driving device layer 200 and the second transparent part 400 is relatively far. Moreover, the light-emitting layer 800 and the second electrode layer 900 are also provided between the second transparent part 400 and the driving device layer 200, and no capacitance affecting the display of the display panel is formed between the second transparent part 400 and the driving device layer 200. The orthographic projection of the power supply wire 420 on the substrate 100 and the orthographic projection of the first signal lines 220 on the substrate 100 at least partially overlap with each other, so that the power supply wire 420 can provide protection to the first signal lines 220.

Optionally, there are multiple ways to set an overlapping area of the orthographic projection of the power supply wire 420 on the substrate 100 and the orthographic projection of the first signal lines 220 on the substrate 100. In some optional embodiments, the overlapping area of the orthographic projection of the power supply wire 420 on the substrate 100 and the orthographic projection of the first signal lines 220 on the substrate 100 is S2, and an area of the orthographic projection of the first signal lines 220 on the substrate 100 is S3, $S2 \geq 60\% * S3$. It is ensured that the overlapping area S2 between the orthographic projection of the power supply wire 420 on the substrate 100 and the orthographic projection of the first signal lines 220 on the substrate 100 is sufficiently large, and the protection of the first signal lines 220 by the second transparent part 400 is improved.

Figure 19:
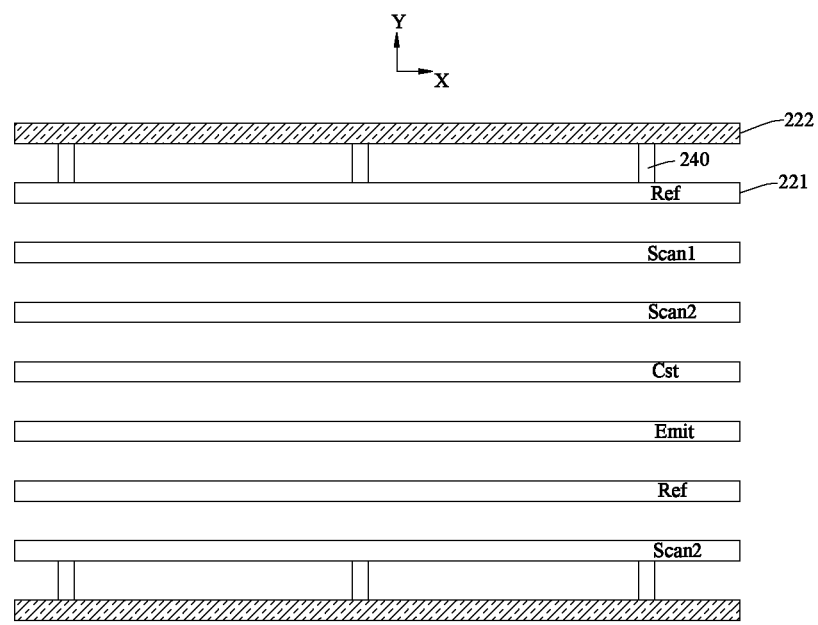
FIG. 19 is a schematic structural view of first signal lines in an exemplary display panel according to various embodiments of the present disclosure.

Referring to FIG. 19, FIG. 19 is a schematic structural view of first signal lines in an exemplary display panel according to various embodiments of the present disclosure.

In the display panel provided by the embodiments of the present disclosure, the first signal lines 220 include: a plurality of first wires 221 extending in the first direction (the X direction in FIG. 19), that the plurality of first wires 221 are spaced apart along the second direction (the Y direction in FIG. 19); and first redundant wires 222, arranged on at least one side of the plurality of first wires 221 in the Y direction.

In a process of etching to form wires, when a certain layer structure contains multiple wires, due to unevenness of the etching process, a width of a first or last wire is narrow, and a service life of the first or last wire is short.

In some alternative embodiments, at least one side of the plurality of first wires 221 in the Y direction is provided with the first redundant wires 222. In an etching process of the first signal lines 220, the first redundant wires 222 are first or last formed by etching. The first redundant wires 222 do not affect signal transmission, and can improve defects of the plurality of first wires 221 caused by uneven etching.

Optionally, the first redundant wires 222 are provided on both sides of the plurality of first wires 221 in the Y direction, which can further improve defects of the plurality of first wires 221 caused by uneven etching.

The plurality of first wires 221 includes, for example, at least one of scan lines, capacitor plates, the voltage reference lines 320, and light-emitting control signal lines 330.

Figure 20:
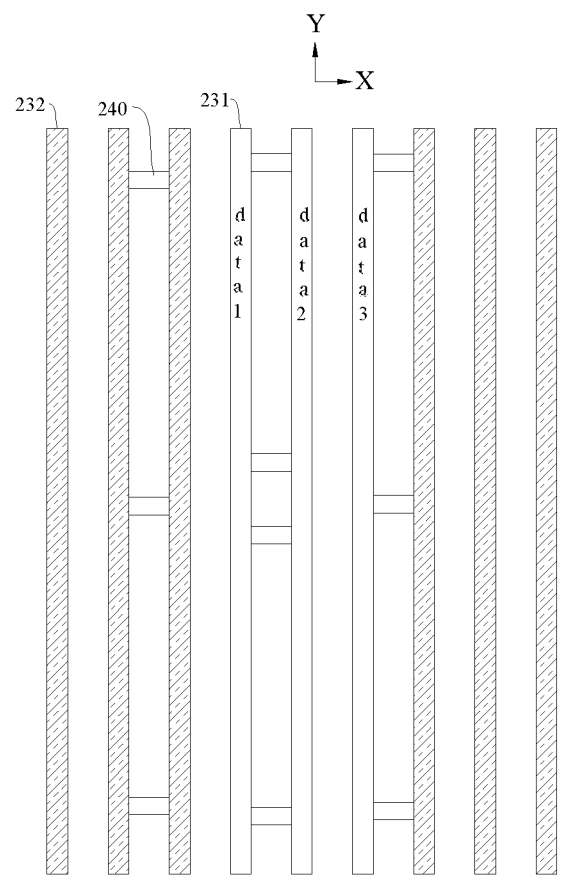
FIG. 20 is a schematic structural view of second signal lines in an exemplary display panel according to various embodiments of the present disclosure.

Referring to FIG. 20, FIG. 20 is a schematic structural view of second signal lines in an exemplary display panel according to various embodiments of the present disclosure.

Optionally, the driving device layer 200 further includes a plurality of second signal lines 230 arranged in a same layer. The plurality of second signal lines 230 and the first signal lines 220 are located in different layers. The plurality of second signal lines 230 includes: a plurality of second wires 231 extending in the Y direction, that the plurality of second wires 231 are spaced apart along the X direction, and the plurality of second wires 231 includes data lines; and second redundant wires 232, arranged on at least one side of the plurality of second wires 231 in the X direction.

In some alternative embodiments, the plurality of second signal lines 230 includes the second redundant wires 232. By providing the second redundant wires 232, uniformity among the plurality of second wires 231 can be improved.

Optionally, to improve the uniformity of the first signal lines 220 and the second signal lines 230, a sum of numbers of the plurality of first wires 221 and the first redundant wires 222 equals to a sum of numbers of the plurality of second wires 231 and the second redundant wires 232.

Figure 21:
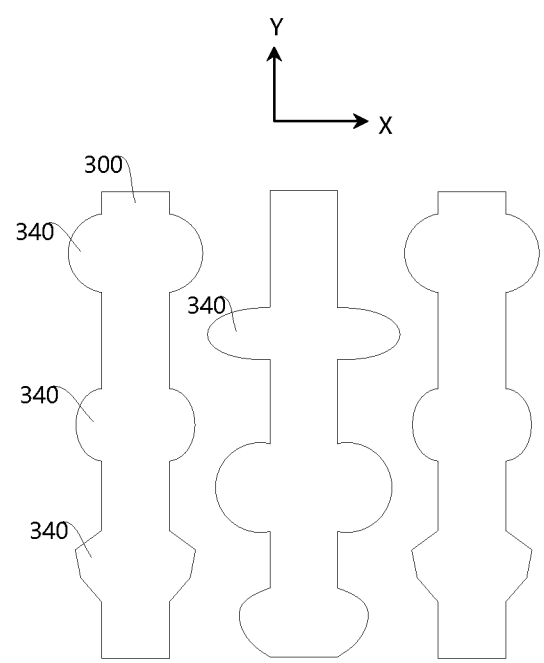
FIG. 21 is a schematic structural view of a first transparent part in an exemplary display panel according to various embodiments of the present disclosure.

Also referring to FIG. 21, FIG. 21 is a schematic structural view of a first transparent part in an exemplary display panel according to various embodiments of the present disclosure.

In some optional embodiments, the first transparent part 300 has two opposite edges in a width direction thereof, and at least one of the two edges is provided with a plurality of protrusions 340 distributed at intervals. There are many ways to arrange the width direction. For example, when an extension size of the first transparent part 300 in the Y direction is larger than its extension size in the X direction, the width direction of the first transparent part 300 is the X direction.

In some alternative embodiments, protrusions are provided on at least one edge of the first transparent part 300, which can improve diffraction of light between two adjacent first transparent parts 300 and/or second transparent parts 400.

Optionally, both edges of the first transparent part 300 are provided with protrusions, which can further improve the diffraction of light between two adjacent first transparent parts 300.

When the plurality of protrusions is provided on the first transparent part 300, shapes of the plurality of protrusions may be the same or different. The shapes of the protrusions may be, for example, semicircles or polygons.

Optionally, not only the protrusions may be provided on the first transparent part 300, but the protrusions may also be provided on the second transparent part 400. The second transparent part 400 has two opposite edges in a width direction thereof, and at least one of the two edges is provided with a plurality of protrusions distributed at intervals. When an extension size of the second transparent part 400 in the X direction is smaller than its extension size in the Y direction, the width direction of the second transparent part 400 may be the X direction. It can improve the diffraction of light between two adjacent second transparent parts 400. Optionally, both edges of the second transparent part 400 are also provided with protrusions, which can further improve the light diffraction between two adjacent second transparent parts 400.

The embodiments of the present disclosure also provide a display device, including the display panel of any one of the foregoing embodiments.

Therefore, the display device of the embodiments of the present disclosure includes the above-mentioned display panel. Therefore, the display device of the embodiments of the present disclosure has the beneficial effects of the above-mentioned display panel. The display device of the embodiments of the present disclosure can realize a full-screen design and has a higher yield.

Figure 22:
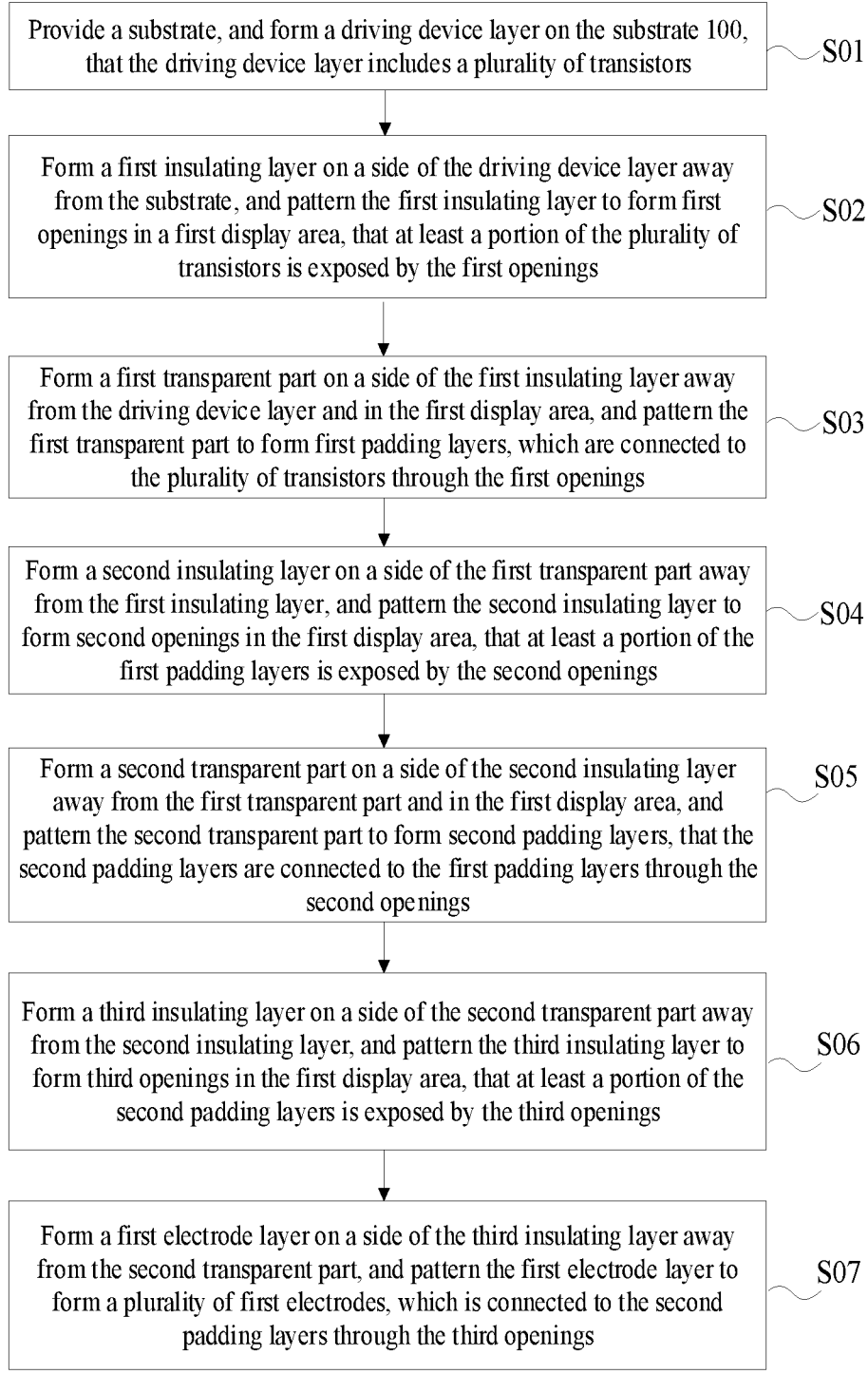
FIG. 22 is a flowchart of a fabrication method of an exemplary display panel according to various embodiments of the present disclosure.

Referring to FIG. 22, FIG. 22 is a flowchart of a fabrication method of an exemplary display panel according to various embodiments of the present disclosure.

A fabrication method of the display panel provided by the embodiments of the present disclosure includes steps S01, S02, S03, S04, S05, S06, and S07.

In step S01, a substrate 100 is provided, and a driving device layer 200 is formed on the substrate 100. The driving device layer 200 includes a plurality of transistors 210.

In step S02, a first insulating layer 600 is formed on a side of the driving device layer 200 away from the substrate 100, and the first insulating layer 600 is patterned to form first openings in the first display area AA1. At least a portion of the plurality of transistors 210 is exposed by the first openings.

In step S03, a first transparent part 300 is formed on a side of the first insulating layer 600 away from the driving device layer 200, the first transparent part 300 is located in the first display area AA1, and the first transparent part 300 is patterned to form first padding layers 310. The first padding layers 310 are connected to the plurality of transistors 210 through the first openings.

Optionally, when the first transparent part 300 includes reference voltage lines and/or signal lines 330, the first transparent part 300 is patterned to also form the reference voltage lines and/or the signal lines 330.

In step S04, a second insulating layer is formed on a side of the first transparent part 300 away from the first insulating layer 600, and the second insulating layer is patterned to form second openings in the first display area AA1. At least a portion of the first padding layers 310 is exposed by the second openings.

In step S05, a second transparent part 400 is formed on a side of the second insulating layer away from the first transparent part 300, the second transparent part 400 is located in the first display area AA1, and the second transparent part 400 is patterned to form second padding layers 410. The second padding layers 410 are connected to the first padding layers 310 through the second openings.

Optionally, when the second transparent part 400 further includes a power supply wire 420, the second transparent part 400 is patterned to also form the power supply wire 420.

In step S06, a third insulating layer is formed on a side of the second transparent part 400 away from the second insulating layer, and the third insulating layer is patterned to form third openings in the first display area AA1. At least a portion of the second padding layers 410 is exposed by the third openings.

In step S07, a first electrode layer 500 is formed on a side of the third insulating layer away from the second transparent part 400, and the first electrode layer 500 is patterned to form a plurality of first electrodes 510. The plurality of first electrodes 510 is connected to the second padding layers 410 through the third openings.

Optionally, after step S07, the method further includes sequentially forming a light-emitting layer 800 and a second electrode layer 900 on a side of the first electrode layer 500 away from the third insulating layer.

In the display panel formed according to the fabrication method of the embodiments of the present disclosure, the plurality of first electrodes 510 are connected to the plurality of transistors 210 through the second padding layers 410 and the first padding layers 310, and light transmittance of the second padding layers 410 and the first padding layers 310 is relatively high, which can effectively increase the light transmittance of the first display area AA1 on the display panel. When the display panel is provided with a photosensitive element in the first display area AA1, the photosensitive element can obtain light through the first display area AA1. In addition, the plurality of first electrodes 510 is also provided in the first display area AA1, and the plurality of transistors 210 can drive the plurality of first electrodes 510 so that the first display area AA1 can display images, increase the display area of the display panel, and realize a full-screen design.

According to the display panel formed by the fabrication method of the embodiments of the present disclosure, the display panel is provided with the first transparent part 300 and the second transparent part 400 in the first display area AA1. During a fabrication process of the display panel, when a common layer is etched by a laser or other methods, since the second transparent part 400 is added, a distance between the common layer and the first transparent part 300 can be increased, and damage to the first transparent part 300 caused by laser etching can be improved, thereby improving the yield of the display panel.

Although the present disclosure has been described with reference to the embodiments, various improvements can be made without departing from the scope of the present disclosure and the components therein can be replaced with equivalents. In particular, as long as there is no structural conflict, the various technical features mentioned in the various embodiments can be combined in any manner. The present disclosure is not limited to the embodiments disclosed in the text, but includes all technical solutions falling within the scope of the claims.

What is claimed is:

1. A display panel having a first display area and a second display area, the display panel comprising:
   a substrate;
   a driving device layer on a side of the substrate, wherein the driving device layer includes a plurality of transistors;
   a first electrode layer in the first display area and on a side of the driving device layer away from the substrate, wherein the first electrode layer includes a plurality of first electrodes;
   a first transparent part in the first display area and between the driving device layer and the first electrode layer, wherein the first transparent part includes first padding layers, and the first padding layers are electrically connected to the plurality of transistors; and
   a second transparent part in the first display area and between the first transparent part and the plurality of first electrodes, wherein the second transparent part includes second padding layers for connecting to the first padding layers, wherein the plurality of transistors transmits signals to the plurality of first electrodes through the first padding layers and the second padding layers, wherein
   an area of a second orthographic projection of the second transparent part on the substrate is larger than an area of a first orthographic projection of the first transparent part on the substrate, and at least a portion of the first orthographic projection is within the second orthographic projection;
   the second transparent part further includes a power supply wire, and at least a portion of an orthographic projection of the first padding layers on the substrate overlaps an orthographic projection of the power supply wire on the substrate; and
   the first transparent part includes signal lines, the signal lines provide electrical signals for the plurality of transistors, the power supply wire includes openings, the openings are filled with insulating filling portions, and an orthographic projection of the insulating filling portions on the substrate covers at least a portion of the signal lines.

2. The display panel according to claim 1, further comprising:
   a first insulating layer between the first transparent part and the driving device layer, wherein the first insulating layer includes first via-holes, the first padding layers are connected to the plurality of transistors through the first via-holes, and an orthographic projection of the first via-holes on the substrate is within the second orthographic projection.

3. The display panel according to claim 1, wherein:
   the first transparent part includes voltage reference lines, and the orthographic projection of the power supply wire on the substrate and an orthographic projection of the voltage reference lines on the substrate at least partially overlap with each other.

4. The display panel according to claim 3, wherein:
   an overlapping area of the orthographic projection of the power supply wire on the substrate and the orthographic projection of the voltage reference lines on the substrate is S, and an area of the orthographic projection of the voltage reference lines on the substrate is S1, wherein S≥60%*S1.

5. The display panel according to claim 3, wherein:
   the driving device layer further includes first signal lines, the first signal lines provide signals for the plurality of transistors, and the orthographic projection of the power supply wire on the substrate and an orthographic projection of the first signal lines on the substrate at least partially overlap with each other.

6. The display panel according to claim 5, wherein:
   the first signal lines include:
   a plurality of first wires, extending along a first direction, wherein the plurality of first wires is spaced apart along a second direction; and
   first redundant wires, arranged on at least one side of the plurality of first wires in the second direction.

7. The display panel according to claim 6, wherein:
   the plurality of first wires includes at least one of scan lines, capacitor plates, the voltage reference lines, and light-emitting control signal lines.

8. The display panel according to claim 5, wherein:
the driving device layer further includes a plurality of second signal lines arranged in a same layer, the plurality of second signal lines and the first signal lines are disposed in different layers, and the plurality of second signal lines includes:
a plurality of second wires, extending in the second direction, wherein the plurality of the second wires is spaced apart along the first direction, and the plurality of second wires includes data lines; and
second redundant wires, arranged on at least one side of the plurality of second wires in the first direction.

9. The display panel according to claim 8, wherein:
a total number of the plurality of first wires and the first redundant wires equals to a total number of the plurality of second wires and the second redundant wires.

10. The display panel according to claim 8, wherein:
the driving device layer further includes connecting lines for connecting to adjacent two of the first signal lines and/or adjacent two of the plurality of second signal lines that transmit same signals.

11. The display panel according to claim 1, wherein:
the power supply wire includes a plurality of power supply blocks and a plurality of connecting leads for connecting to the plurality of power supply blocks, an orthographic projection of each power supply block of the plurality of power supply blocks on the substrate is located between orthographic projections of adjacent two first electrodes of the plurality of first electrodes on the substrate, and orthographic projections of the plurality of connecting leads on the substrate are staggered with the orthographic projections of the plurality of first electrodes on the substrate.

12. The display panel according to claim 11, wherein:
the plurality of power supply blocks is distributed in rows and columns along a first direction and a second direction;
the plurality of connecting leads includes first connecting leads and second connecting leads, and any two of the plurality of power supply blocks adjacent in the first direction are connected to each other through the first connecting leads; and
in two rows of the plurality of power supply blocks adjacent in the second direction, one or more groups of power supply blocks adjacent in the second direction are connected to each other through the second connecting leads.

13. The display panel according to claim 1, wherein:
the first transparent part and/or the second transparent part have two opposite edges in a width direction thereof, and at least one of the two edges is provided with a plurality of protrusions distributed at intervals.

14. The display panel according to claim 1, further comprising:
a metal conductive layer disposed between the driving device layer and the first transparent part, wherein the metal conductive layer includes a metal pad layer, and the metal pad layer is connected between the first padding layers and the plurality of transistors.

15. A display device, comprising:
a display panel having a first display area and a second display area, the display panel including:
a substrate;
a driving device layer on a side of the substrate, wherein the driving device layer includes a plurality of transistors;
a first electrode layer in the first display area and on a side of the driving device layer away from the substrate, wherein the first electrode layer includes a plurality of first electrodes;
a first transparent part in the first display area and between the driving device layer and the first electrode layer, wherein the first transparent part includes first padding layers, and the first padding layers are electrically connected to the plurality of transistors; and
a second transparent part in the first display area and between the first transparent part and the plurality of first electrodes, wherein the second transparent part includes second padding layers for connecting to the first padding layers, wherein the plurality of transistors transmits signals to the plurality of first electrodes through the first padding layers and the second padding layers, wherein:
an area of a second orthographic projection of the second transparent part on the substrate is larger than an area of a first orthographic projection of the first transparent part on the substrate, and at least a portion of the first orthographic projection is within the second orthographic projection;
the second transparent part further includes a power supply wire, and at least a portion of an orthographic projection of the first padding layers on the substrate overlaps an orthographic projection of the power supply wire on the substrate; and
the power supply wire includes a plurality of power supply blocks and a plurality of connecting leads for connecting to the plurality of power supply blocks, an orthographic projection of each power supply block of the plurality of power supply blocks on the substrate is located between orthographic projections of adjacent two first electrodes of the plurality of first electrodes on the substrate, and orthographic projections of the plurality of connecting leads on the substrate are staggered with the orthographic projections of the plurality of first electrodes on the substrate.

* * * * *